(12) United States Patent
Servalli et al.

(10) Patent No.: US 8,008,701 B2
(45) Date of Patent: Aug. 30, 2011

(54) METHOD OF MAKING A FLOATING GATE NON-VOLATILE MOS SEMICONDUCTOR MEMORY DEVICE WITH IMPROVED CAPACITIVE COUPLING AND DEVICE THUS OBTAINED

(76) Inventors: Giorgio Servalli, Ciserano (IT); Daniela Brazzelli, Busto Arsizio (IT)

( * ) Notice: Subject to any disclaimer, the term of this patent is extended or adjusted under 35 U.S.C. 154(b) by 115 days.

(21) Appl. No.: 11/317,641

(22) Filed: Dec. 22, 2005

(65) Prior Publication Data

US 2006/0166438 A1  Jul. 27, 2006

(30) Foreign Application Priority Data

Dec. 22, 2004  (EP) .................................... 04425936
Dec. 22, 2004  (EP) .................................... 04425937

(51) Int. Cl.
*H01L 29/788* (2006.01)
(52) U.S. Cl. ................ 257/315; 257/317; 257/E29.112; 257/E29.129; 257/E29.135
(58) Field of Classification Search .................. 257/321, 257/314–317, E29.112, E29.129, E29.134, 257/E29.135
See application file for complete search history.

(56) References Cited

U.S. PATENT DOCUMENTS

| | | | |
|---|---|---|---|
| 5,739,566 A | 4/1998 | Ota et al. | |
| 5,770,501 A * | 6/1998 | Hong | 438/264 |
| 5,915,177 A | 6/1999 | Tseng | |
| 6,037,605 A * | 3/2000 | Yoshimura | 257/25 |
| 6,153,472 A | 11/2000 | Ding et al. | |
| 6,200,865 B1 | 3/2001 | Gardner et al. | |
| 6,323,516 B1 | 11/2001 | Wang et al. | |
| 6,391,722 B1 * | 5/2002 | Koh | 438/264 |
| 6,420,249 B1 | 7/2002 | Doan et al. | |
| 6,495,467 B2 | 12/2002 | Shin et al. | |
| 6,498,064 B2 * | 12/2002 | Tseng | 438/257 |
| 6,713,834 B2 | 3/2004 | Mori et al. | |
| 2001/0014503 A1 * | 8/2001 | Iguchi et al. | 438/261 |
| 2002/0052079 A1 | 5/2002 | Wen | |
| 2002/0160570 A1 | 10/2002 | Tseng | |
| 2002/0195646 A1 | 12/2002 | Tseng | |
| 2003/0077907 A1 | 4/2003 | Kao et al. | |
| 2003/0160273 A1 | 8/2003 | Hieda | |
| 2003/0203594 A1 * | 10/2003 | Shimizu et al. | 438/424 |
| 2004/0061173 A1 * | 4/2004 | Hu et al. | 257/347 |

(Continued)

FOREIGN PATENT DOCUMENTS

EP  1 091 392 A2  4/2001
(Continued)

OTHER PUBLICATIONS

European Search Report, EP 04 42 5936 (Parent Case).
(Continued)

*Primary Examiner* — Matthew E Warren
(74) *Attorney, Agent, or Firm* — Schwegman, Lundberg Woessner, P.A.

(57) ABSTRACT

A method of making a non-volatile MOS semiconductor memory device includes a formation phase, in a semiconductor material substrate, of isolation regions filled by field oxide and of memory cells separated each other by said isolation regions The memory cells include an electrically active region surmounted by a gate electrode electrically isolated from the semiconductor material substrate by a first dielectric layer; the gate electrode includes a floating gate defined simultaneously to the active electrically region. A formation phase of said floating gate exhibiting a substantially saddle shape including a concavity is proposed.

13 Claims, 13 Drawing Sheets

U.S. PATENT DOCUMENTS

| | | |
|---|---|---|
| 2004/0080020 A1 | 4/2004 | Mori et al. |
| 2004/0126982 A1 | 7/2004 | Park |
| 2006/0024885 A1 * | 2/2006 | Sandhu et al. ............... 438/257 |

FOREIGN PATENT DOCUMENTS

| | | |
|---|---|---|
| JP | 10335497 A * | 12/1998 |
| WO | WO 00/51188 | 8/2000 |

OTHER PUBLICATIONS

European Search Report from EP04425937 mailed May 30, 2005, 9 pgs.
Examination Report from EP04425936.4 mailed Jan. 14, 2009, 4 pgs.
Examination Report from EP04425937.2 mailed Jan. 14, 2009, 4 pgs.
Non-Final Office Action from U.S. Appl. No. 11/317,679, Mailed Jun. 10, 2009, 12 pgs.
Final Office Action from U.S. Appl. No. 11/317,679 mailed Feb. 5, 2009, 14 pgs.
Office Action from U.S. Appl. No. 11/317,679 mailed Aug. 15, 2008, 25 pgs.
Final Office action from U.S. Appl. No. 11/317,679 mailed Dec. 21, 2009, 10 pgs.
Office Action from EP Patent Application No. 04425937.2 mailed Jun. 14, 2010, 6 pages.
Non-Final Office Action from U.S. Appl. No. 11/317,679 mailed May 7, 2010, 15 pgs.
Final Office Action from U.S. Appl. No. 11/317,679 mailed Aug. 23, 2010, 9 pgs.

* cited by examiner

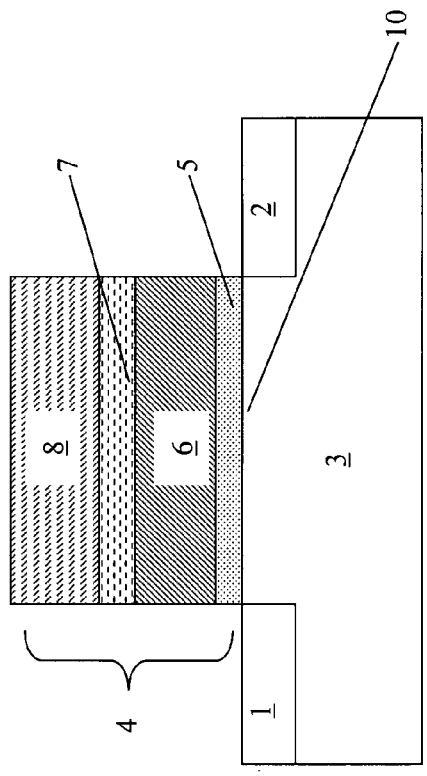
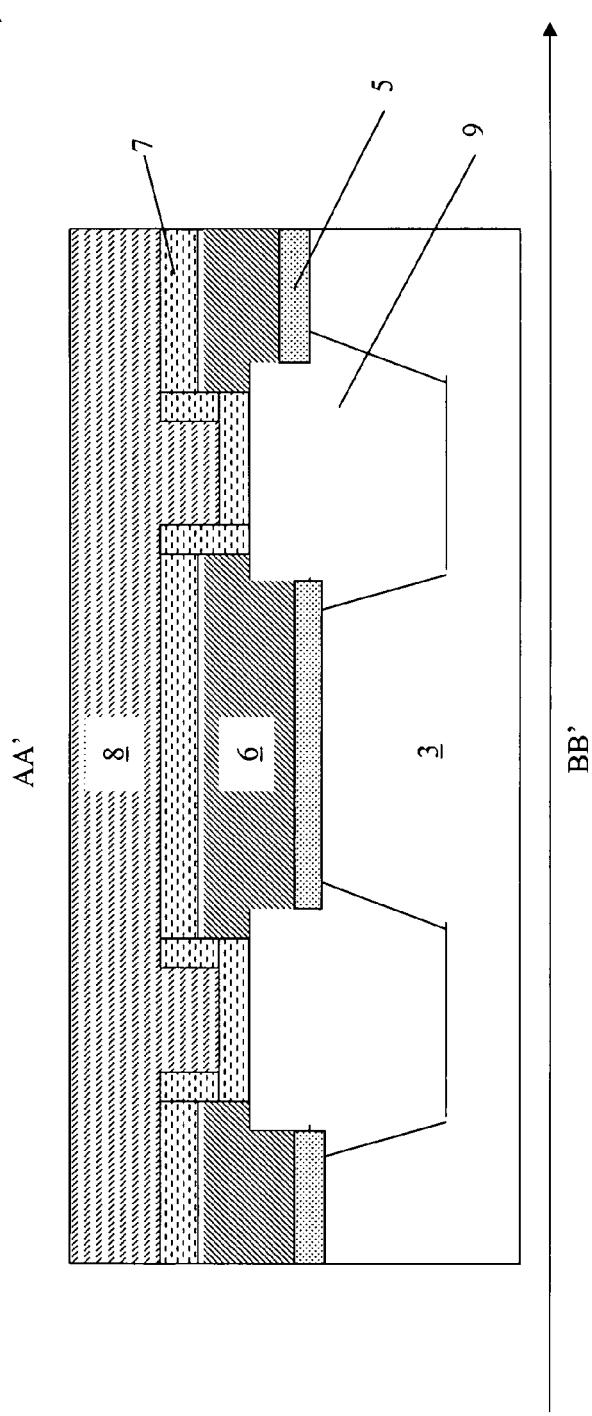
Fig.1
(PRIOR ART)

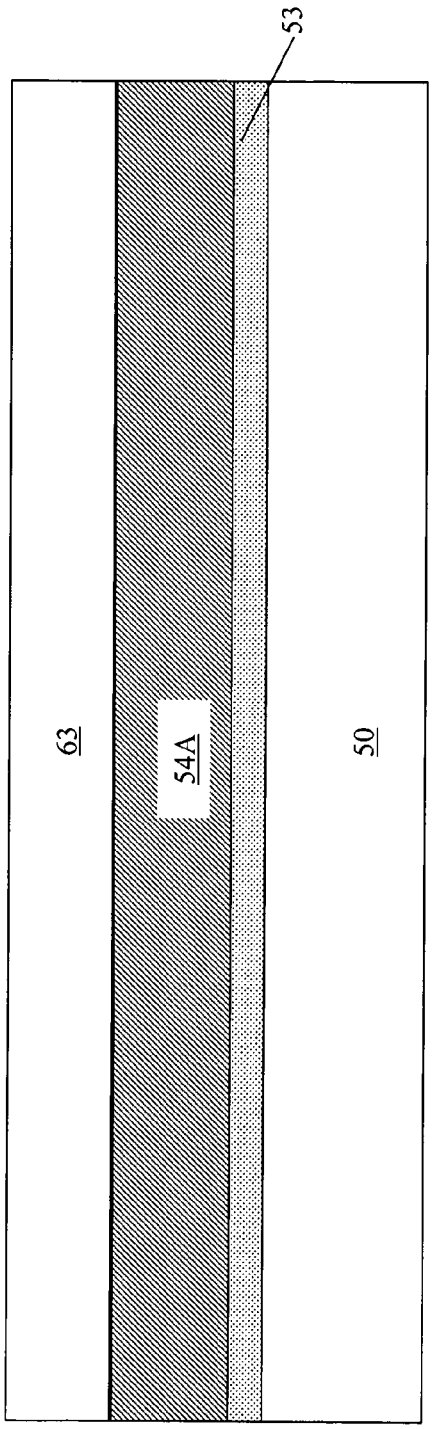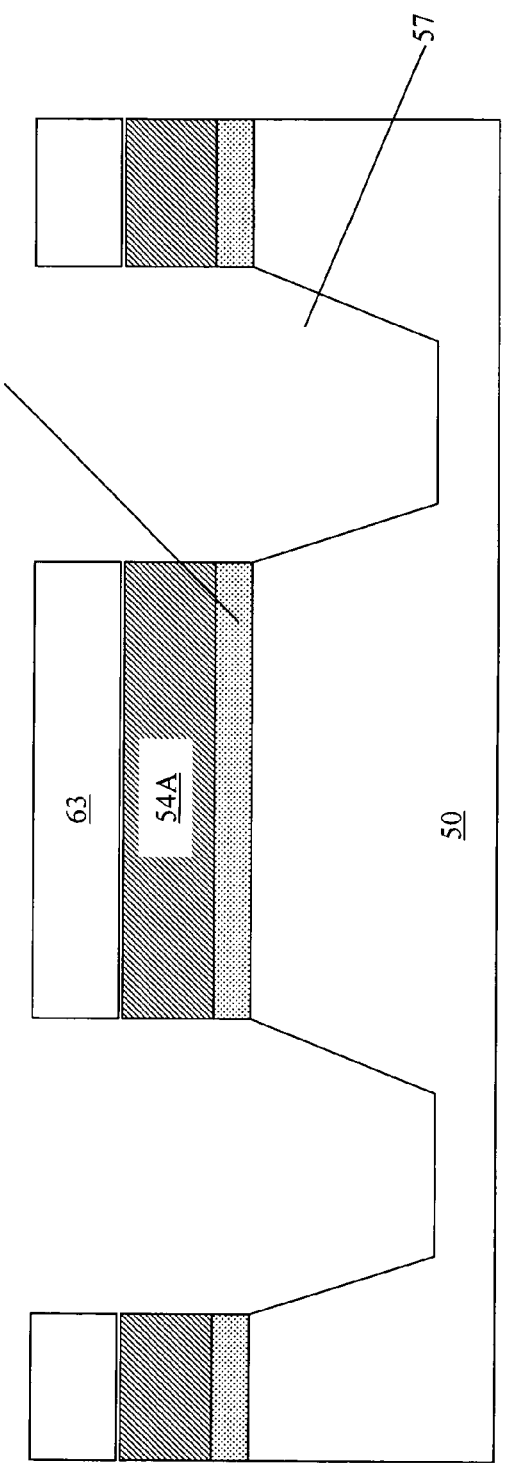

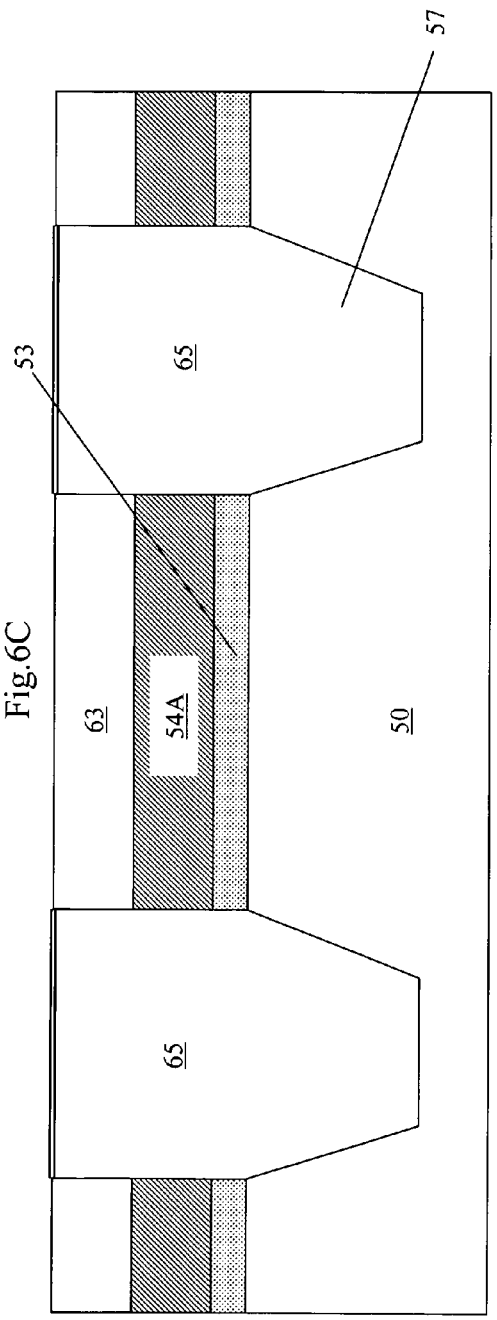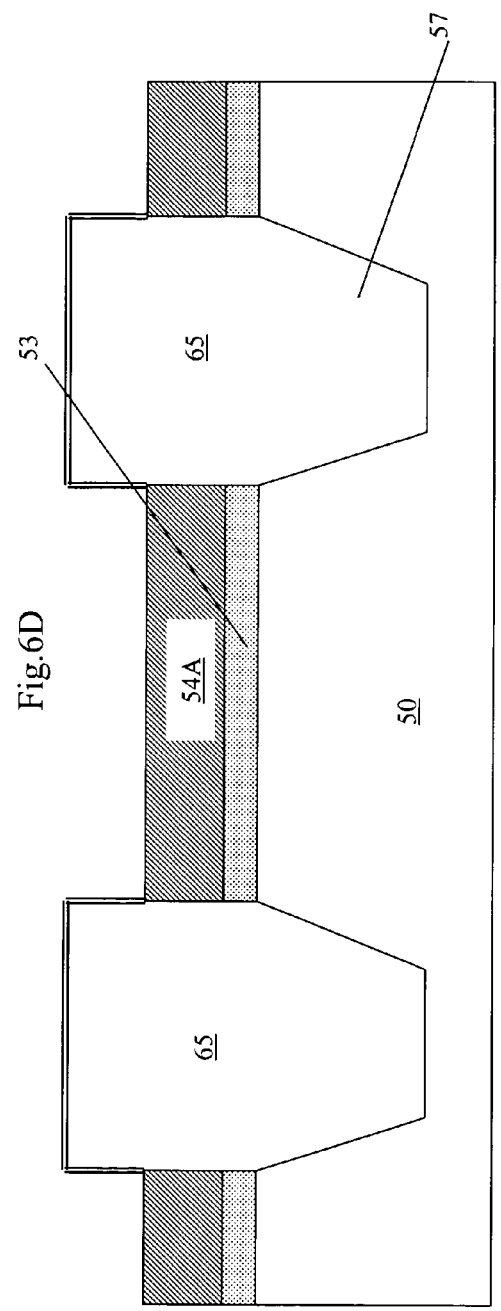

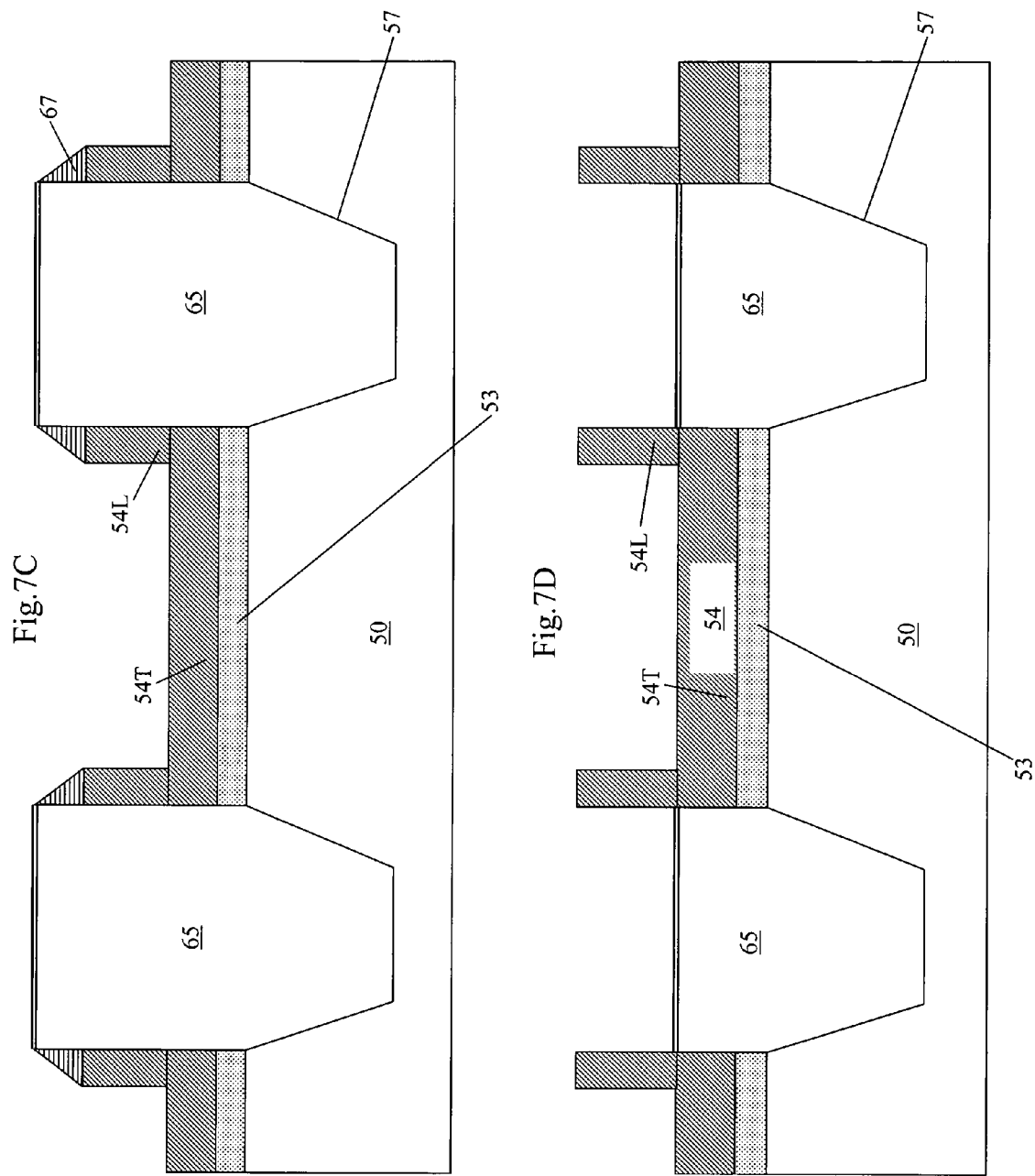

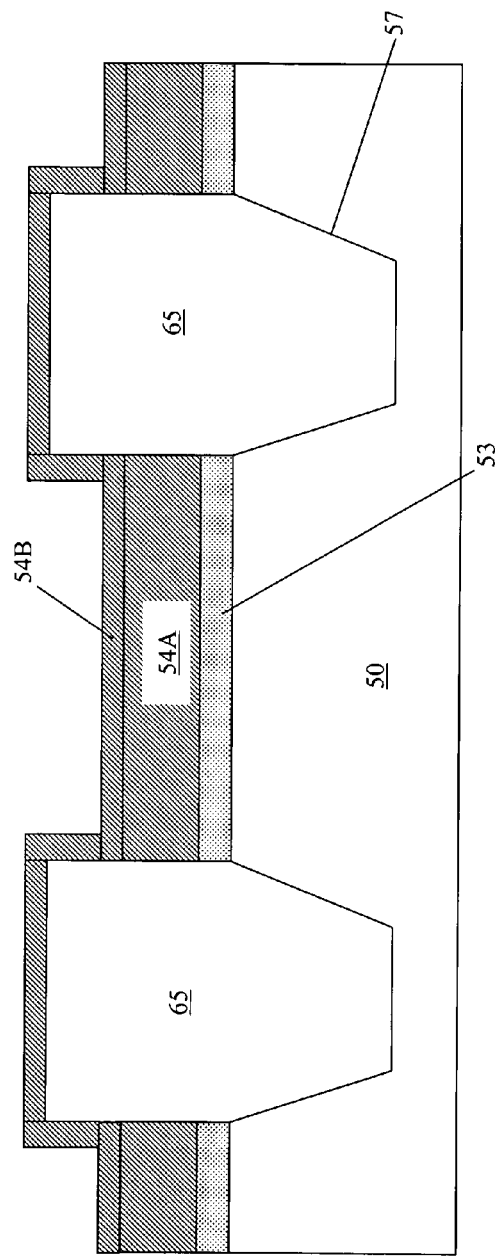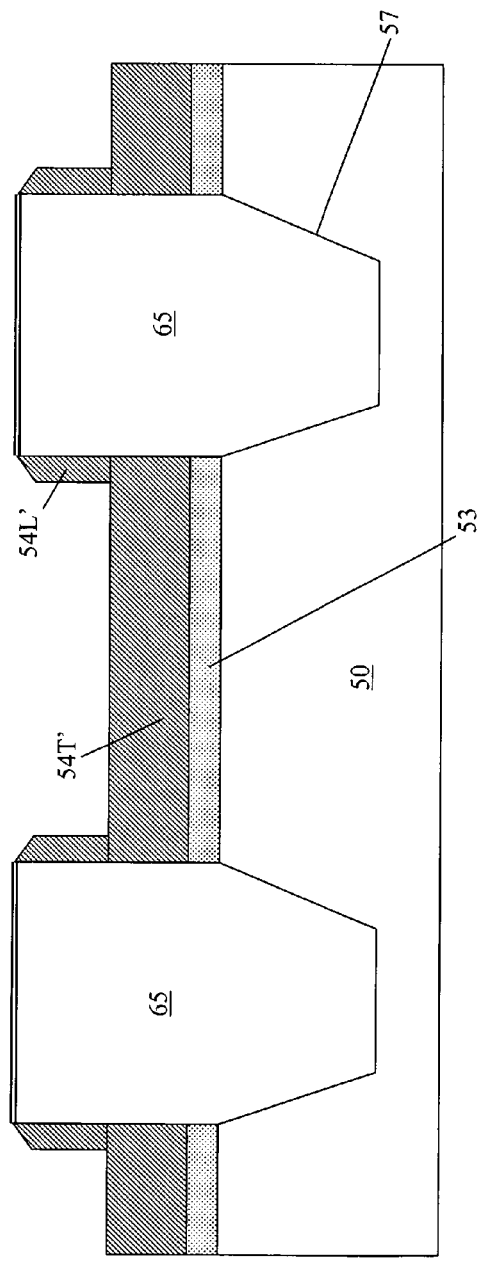

METHOD OF MAKING A FLOATING GATE NON-VOLATILE MOS SEMICONDUCTOR MEMORY DEVICE WITH IMPROVED CAPACITIVE COUPLING AND DEVICE THUS OBTAINED

CROSS REFERENCE TO RELATED APPLICATIONS

This application is related to U.S. patent application Ser. No. 11/317,679 entitled METHOD OF MAKING A FLOATING GATE NON-VOLATILE MOS SEMICONDUCTOR MEMORY DEVICE WITH IMPROVED CAPACITIVE COUPLING, which has a common filing date and owner and which is incorporated by reference.

PRIORITY CLAIM

This application claims priority from European patent application Nos. 04425936.4 and 04425937.2 both filed Dec. 22, 2004, which are incorporated herein by reference.

TECHNICAL FIELD

The present invention relates generally to a method of making a semiconductor memory device.

More precisely, the present invention relates to a method of making a floating gate non-volatile MOS memory device.

BACKGROUND

Memories are devices able to store and to make accessible information stored in binary form as bits, and they can be subdivided in various categories according to the storage capacity and to the time necessary to retrieve the information stored therein.

Semiconductor memories are made in MOS (metal-oxide-semiconductor) technology on a semiconductor material substrate, typically single crystalline silicon, and are called non-volatile when they retain the information for considerable times and in absence of power supply.

Among non-volatile MOS memories, a particularly important class is that constituted by floating gate devices, in which the single cell is constituted by a MOSFET (metal-oxide-semiconductor field effect transistor) in which the gate electrode includes an additional electrode (floating gate) placed between the channel and the control electrode (control gate), completely surrounded by electrical insulation and separated by a dielectric from the control gate.

The information stored in the cell is represented by the charging state of the gate electrode, that is modified by either injecting electrons from the FET into the floating gate (writing) or removing them (erasing).

In absence of relatively high voltages applied to the FET electrodes, the floating gate charge remains almost unaltered in time because the electrons remain in such electrode without dispersing into the surrounding environment, thanks to the presence of insulating layers that surround the floating gate.

Among the floating gate non-volatile MOS memories, a dominant position is occupied by flash memories, whose main features are given by the possibility of being written and erased electrically, by random access not only for reading but even for writing, and by the considerable high integration density, due to the presence of a particularly compact single transistor elementary cell.

In flash memories, the mechanism adopted for writing, or programming, a memory cell is the injection into the floating gate of "hot" electrons coming from the channel and "heated" by the application of a suitable potential difference between source and drain.

In a write operation, some ten of thousands of electrons are injected into the floating gate, and the retention thereof inside the floating gate provides the memory non-volatility.

The physical mechanism adopted for erasing a flash memory cell, an operation in which the floating gate substantially is emptied of the electrons injected during the writing, is the tunneling through a dielectric of the electrons from the floating gate to the source, made possible by the application of a suitable potential difference between the control gate and the source.

The efficiency of this charge transfer process is measured by the capacitive coupling between control gate and floating gate, that is expressed in terms of a capacitive coupling coefficient $\alpha_G$, defined as the ratio between the capacitance $C_{CG}$ of the control gate and the total capacitance $C_{TOT}$ associated with the gate electrode, that also takes into account the capacitive couplings due to the presence of the source $C_S$, of the drain $C_D$, of the tunnel oxide and of the channel $C_{FG}$:

$$\alpha_G = C_{CG}/C_{TOT} = C_{CG}/(C_{CG}+C_{FG}+C_S+C_D).$$

According to a model widely in use, the sequence of control gate/dielectric/floating gate layers can be represented as a capacitor with plane and parallel plates separated by a dielectric, the floating gate and the control gate being the two plates thereof.

The capacitive coupling coefficient $\alpha_G$ is thus proportional to the capacitance $$C_{CG} = \epsilon_{diel}(A_{FG}/T_{diel})$$

where $\epsilon_{diel}$ is the dielectric constant of the dielectric, $A_{FG}$ is the area of the floating gate surface facing the control gate, and $T_{diel}$ is the dielectric thickness.

Consequently, the capacitive coupling coefficient $\alpha_G$ strongly depends on the shape and the size of the floating gate and, in particular, it is proportional to the floating gate surface area facing the control gate.

In FIGS. 1 and 2 there are shown, in simplified way, respectively a cross section and a circuit scheme of a portion of a matrix 200 of flash memory cells, such cross section being taken along a direction AA' and along a direction BB' perpendicular thereto.

FIG. 1 evidences the layered structure of the gate electrode region 4, the wells of the source region 1 and drain region 2, and the central electrically active region 10, formed by the FET channel within a silicon single crystalline substrate 3.

Over the FET channel 10 the gate-electrode region 4 is constituted by:
  a first thin dielectric layer 5, typically silicon oxide, called tunnel oxide;
  the floating gate 6, usually formed by a heavily doped polycrystalline silicon layer;
  a second dielectric layer 7, made for example of a succession of $SiO_2/Si_3N_4/SiO_2$ thin layers called ONO (acronym for oxide-nitride-oxide), that covers the floating gate 6;
  the control gate 8, typically formed by a heavily doped polycrystalline silicon layer.

Along the direction BB', the memory cells 100 are separated by insulating regions 9, that in the currently more advanced technologies are of STI (shallow trench isolation) type, i.e., they are constituted by trenches in the single crystalline silicon substrate 3, filled up by one or more dielectric layers.

Typically, the memory cells 100 are organized in a matrix structure, that, as shown by way of example in FIG. 2 for a NOR matrix 200 of flash type memory cells 100, is arranged in rows 21, called word lines, running along the direction BB', and columns 22, called bit lines, running along the direction AA'.

In the matrix 200, the control gates 8 of the memory cells 100 form the word lines 21, and along this direction source connection lines 24, constituted by semiconductor material, extend in regular intervals, for example every sixteen cells, running parallel to the bit lines 22.

The bit lines 22, which constitutes the drain connection lines, are formed by conductor material, typically a metal or an alloy of one or more metals (for example Al, AlCu, Cu, W . . . ) and run perpendicularly to the word lines 21.

In the direction of the bit lines 22, the drains 2 of adjacent memory cells 100 face each other, and in correspondence to each pair of faced drains 2, drain electric contacts 23 are provided along the bit lines 22, connecting the drains 2 to the bit lines 22.

Also the sources 1 of adjacent memory cells 100 face each other in the direction of the bit lines 22, and the diffusion source lines 26 connect them to source connection lines 24 by means of source electric contacts 25, along the direction of the word lines 21.

A conventional process for fabrication of flash memories calls for the formation of the isolation regions 9, for example of STI type, and of the floating gates 6 of the memory cells 100 through the following phases:

1. On the single crystalline silicon substrate 3, a sufficiently thin dielectric layer is grown, of thickness ranging from 10 to 20 nm, called pad oxide;

2. On the pad oxide, a silicon nitride layer of thickness typically ranging from 100 nm to 200 nm is deposited, that has the function of stop layer for the following planarization treatments;

3. The areas where the STI type isolation regions 9 will be made are defined by lithography;

4. The nitride layer and the pad oxide are removed in sequence from these areas, and trenches of the desired depth, typically about 150 nm, are formed inside the single crystalline silicon bulk 3;

5. The trenches are filled with one or more layers of dielectric material, that as a whole are called field oxide;

6. The field oxide is planarized, typically using the CMP (chemical mechanical polishing) technique, in such a way as its exposed surface is flush with that of the still present nitride portion;

7. The exposed field oxide surface level is lowered, typically by a wet etch in hydrofluoric acid (HF), so that at the end of the process the height difference between the field oxide surface and the surface of the single crystalline silicon substrate 3 is not too high (~20 nm).

After having formed in this way the STI type isolation regions 9, the process of formation of the floating gates 6 of the memory cells 100 proceeds with the following phases:

8. The portion of nitride still present is removed;

9. A sacrificial dielectric layer called sarox is grown, of thickness approximately equal to 10 nm,;

10. Through the sarox layer, some phases of dopant implantation are performed, necessary to the operation of the memory cell 100;

11. The sarox layer and the pad oxide layer are removed by wet etching;

12. The tunnel oxide 5 is grown, of thickness ranging from 5 nm to 10 nm;

13. A polycrystalline silicon layer is deposited, of about 100 nm thickness;

14. The polycrystalline silicon layer is defined by lithography and etching, so as to form the floating gate 6 of the memory cell 100;

15. The layer of ONO (oxide-nitride-oxide) 7 is deposited, covering the floating gate 6;

16. The control gate 8 is formed, typically made of heavily doped polycrystalline silicon.

In the last generation technologies, the memory-cell dimensions 100 are so small that to use traditional lithography for the definition of the floating gate 6, mask alignment is often critical. In fact, a possible misalignment, even minimum, in the lithographical definition phase (14 above) of the polycrystalline silicon layer, might be too great for such small geometries, and cause the memory cell 100 to be incorrectly defined.

On the other hand, the quest to reduce the memory dimensions becomes more and more pressing as the technology progresses, and this demand translates into the necessity of devising technological solutions and innovative integrated structures that allow combining, in such devices, an optimal electric behavior with minimal geometric dimensions.

Therefore, the possibility has been investigated of making a memory cell with self-aligned insulation, so called because the electrically active regions and the floating gate are defined simultaneously. The floating gate is thus automatically aligned to the isolation regions. An example of flash memory cell 300 with self-aligned insulation is shown in FIG. 3 in schematic transversal section along the direction BB', not to scale and limited to the layers of interest. Along the direction AA', the flash memory cell 300 has a structure similar to the memory cell 100 shown in FIG. 1.

In detail, the solution with self-aligned insulation provides for forming isolation regions 9, for example of STI type, and the floating gates 6A of the memory cells 300 through the following phases:

1A. The tunnel oxide 5 is grown on the single crystalline substrate 3;

2A. A polycrystalline silicon layer, forming the floating gate 6A, of thickness about of 200 nm is deposited;

3A. A silicon nitride layer of thickness typically ranging from 100 nm to 200 nm, having the function of stop layer for the following planarization treatments, is deposited;

4A. The STI type isolation regions are defined by lithography and etch of the sequence of silicon nitride layer, the polycrystalline silicon layer, the tunnel oxide 5 layer and single crystalline substrate 3, up to formation of trenches of desired depth, typically about of 150 nm, inside the single crystalline silicon substrate 3.

The floating gates 6A thus defined are self-aligned to the type STI isolation regions.

5A. The trenches are filled with the field oxide;

6A. The field oxide is planarized, typically using the CMP (chemical mechanical polishing) technique, in such a way that the exposed surface thereof is flush with that of the silicon nitride layer.

7A. The silicon nitride layer is removed by isotropic etching;

8A. The level of the exposed surface of the field oxide is lowered, typically by wet etching in hydrofluoric acid (HF), in such a way to uncover the side walls of the floating gate 6A.

9A. The ONO (oxide-nitride-oxide) layer 7, covering the floating gate 6, is deposited;

10A. The control gate 8, typically made of heavily doped polycrystalline silicon, is formed.

Since in this way the floating gate 6A is self aligned to the STI-type isolation regions 9, this process flow allows obtaining memory cells 300 of reduced dimensions compared to the memory cells 100 made with the traditional process flow.

Regretfully, for a given thickness of deposited polycrystalline silicon, this last-generation process flow produces floating gates 6A of such a morphology that strongly reduces the capacitive coupling coefficient $\alpha_G$ between the floating gate 6A and the control gate 8.

In fact, comparing the morphology of the traditional floating gate 6 of the memory cell 100 with that of the floating gate 6A of the memory cell 300 with self-aligned insulation as represented in FIG. 4, it can be noticed that the traditional floating gate 6 has some protrusions, so-called "wings", that extend over the adjacent STI-type isolation regions 9. Such wings are instead missing in the case of the floating gate 6A of the memory cell 300 with self-aligned insulation.

The lack of these "wings", due to the complexity of the process phases that are used for the realization of the floating gate 6A, causes the width W2 of the floating gate 6A to be smaller than the width W1 of the traditional floating gate 6.

Besides, the effective thickness T2 of the floating gate 6A is also lower than that of the traditional floating gate 6, indicated with T1.

This difference is due to the fact that in the process flow realizing the floating gate 6A the lowering step of the level of the exposed field oxide surface (step 8A) is performed after the growth phase (step IA) of the tunnel oxide 5. Therefore a margin, on the order of the about ten nanometers, is required in the lowering phase (step 8A) of the exposed field-oxide surface so as to preserve the tunnel oxide 5.

Accordingly, the side walls of the floating gate 6A are partially covered by field oxide, and therefore the effective thickness T2 of the floating gate 6A is lower than the effective thickness T1 of the traditional floating gate 6.

These differences in the geometric dimensions of the floating gate 6 and 6A are reflected in the values of the capacitive coupling coefficients $\alpha_G$ of the traditional memory cells 100 and 300 with self-aligned insulation, whose ratio is expressed by the relationship:

$$\alpha_G(300)/\alpha_G(100) \div (W2+2T2)/(W1+2T1)$$

from which it can be deduced that, W2 and T2 being lower than W1 and T1, the capacitive coupling coefficient $\alpha_G$ of the memory cell 300 with self-aligned insulation is lower than the corresponding capacitive coupling coefficient $\alpha_G$ of the traditional memory cell 100.

It has been verified experimentally that this difference can be estimated to be of order of at least 10 percent.

Such an efficiency loss in the capacitive coupling $\alpha_G$ leads to an increase in the erasing time of the memory cell 300 with self-aligned insulation, since the charge transfer process from the floating gate 6A to the source region 1 is less efficient, and thus may cause the final erase voltage to be higher than with the floating gate 6.

The management of high erase voltages is often burdensome and can cause phenomena such as degradation of the quality of the active oxides, worsening the characteristics of reliability of the memory cell 300 with self-aligned insulation, the electric performance of which may be accordingly limited.

The formation of the floating gate 6A starting from a thicker deposited polycrystalline silicon allows partial recovery of the loss of capacitive coupling between floating gate and control gate, but this may introduce other problems; in particular, the filling by field oxide of the isolation trenches may become difficult because of the increased depth of the trench to be filled.

SUMMARY

According to an embodiment of the invention, a method is provided for obtaining a floating gate non-volatile MOS memory device having very small geometric dimensions, and in which the memory cells have a capacitive coupling coefficient $\alpha_G$ between control gate and floating gate higher than that obtainable according to the prior art, thus overcoming limitations and drawbacks that still limit the devices of this type made according to the prior art.

Another embodiment of the invention concerns a floating gate non-volatile MOS semiconductor memory cell with self-aligned insulation.

BRIEF DESCRIPTION OF THE DRAWINGS

In FIG. 1 there is shown in schematic transversal section a flash memory cell according to the prior art, along two perpendicular directions AA' and BB';

FIGS. 6A-6D show, in transversal section along the direction BB' and in schematic way, some phases of a method of making a non-volatile MOS memory device with floating gate with self-aligned insulation, according to an embodiment of the invention;

FIGS. 7A-7E show, in transversal section along the direction BB', and in schematic way, a sequence of phases of a method of making a non-volatile MOS memory device with floating gate with self-aligned insulation according to a first embodiment of the invention;

FIGS. 8A-8D show, in transversal section along the direction BB' and in schematic way, a sequence of phases of a method of making a non-volatile MOS memory device with floating with self-aligned insulation to STI-type isolation regions according to a second embodiment of the invention.

DETAILED DESCRIPTION

A method of making a non-volatile MOS memory device with floating gate with self-aligned insulation, according to an embodiment of the invention will be now described.

Particularly, the case of a flash type non-volatile MOS memory device with floating gate with self-aligned insulation is considered by way of example.

The example does not constitute a limitation of the present invention, which can also be applied also to different types of non-volatile MOS memory devices with floating gates that use a self-aligned insulation scheme.

Figure 2:
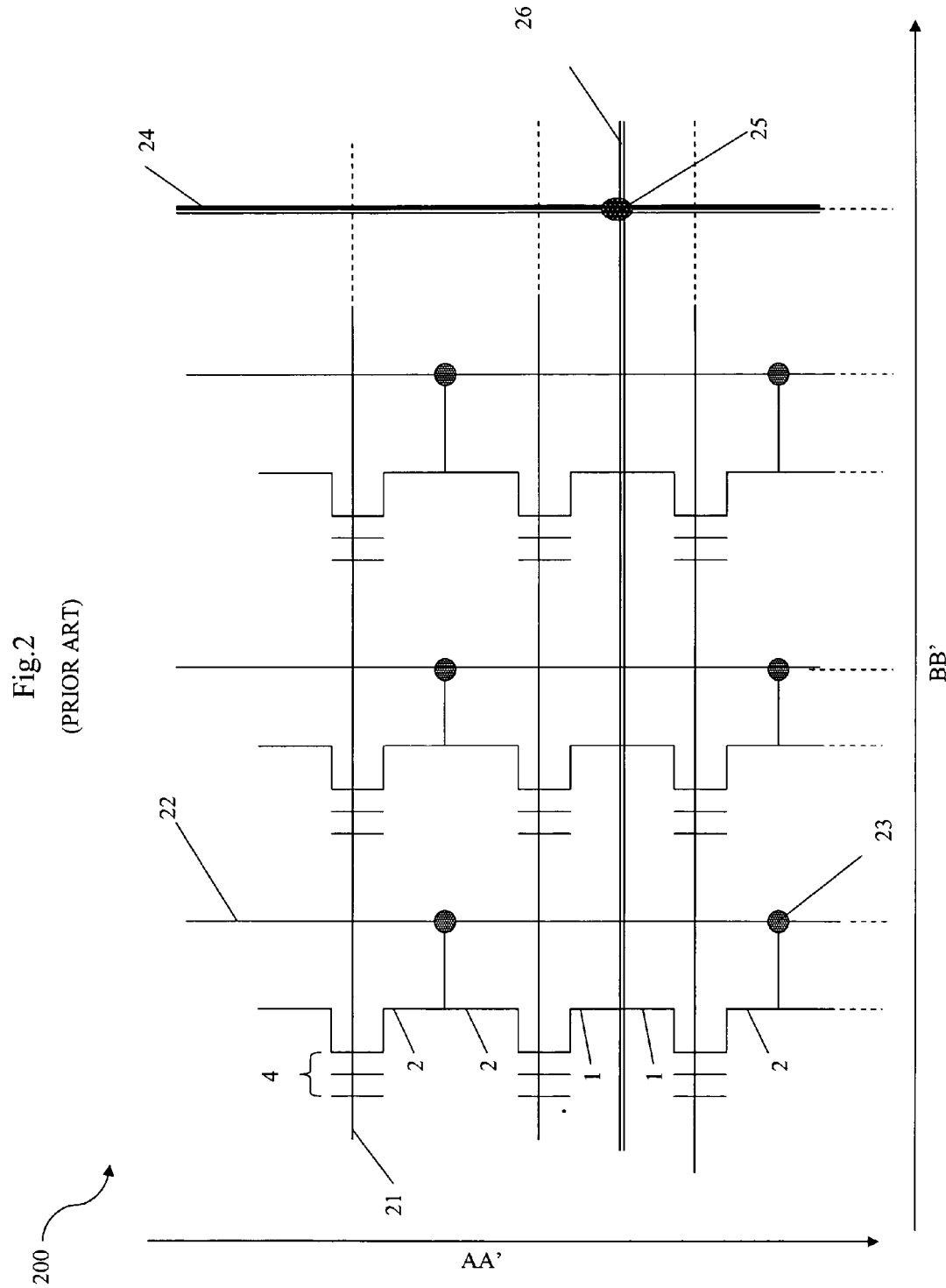
In FIG. 2 a circuit diagram of a portion of a typical matrix structure of flash NOR memory cells according to the prior art is shown.
Figure 3:
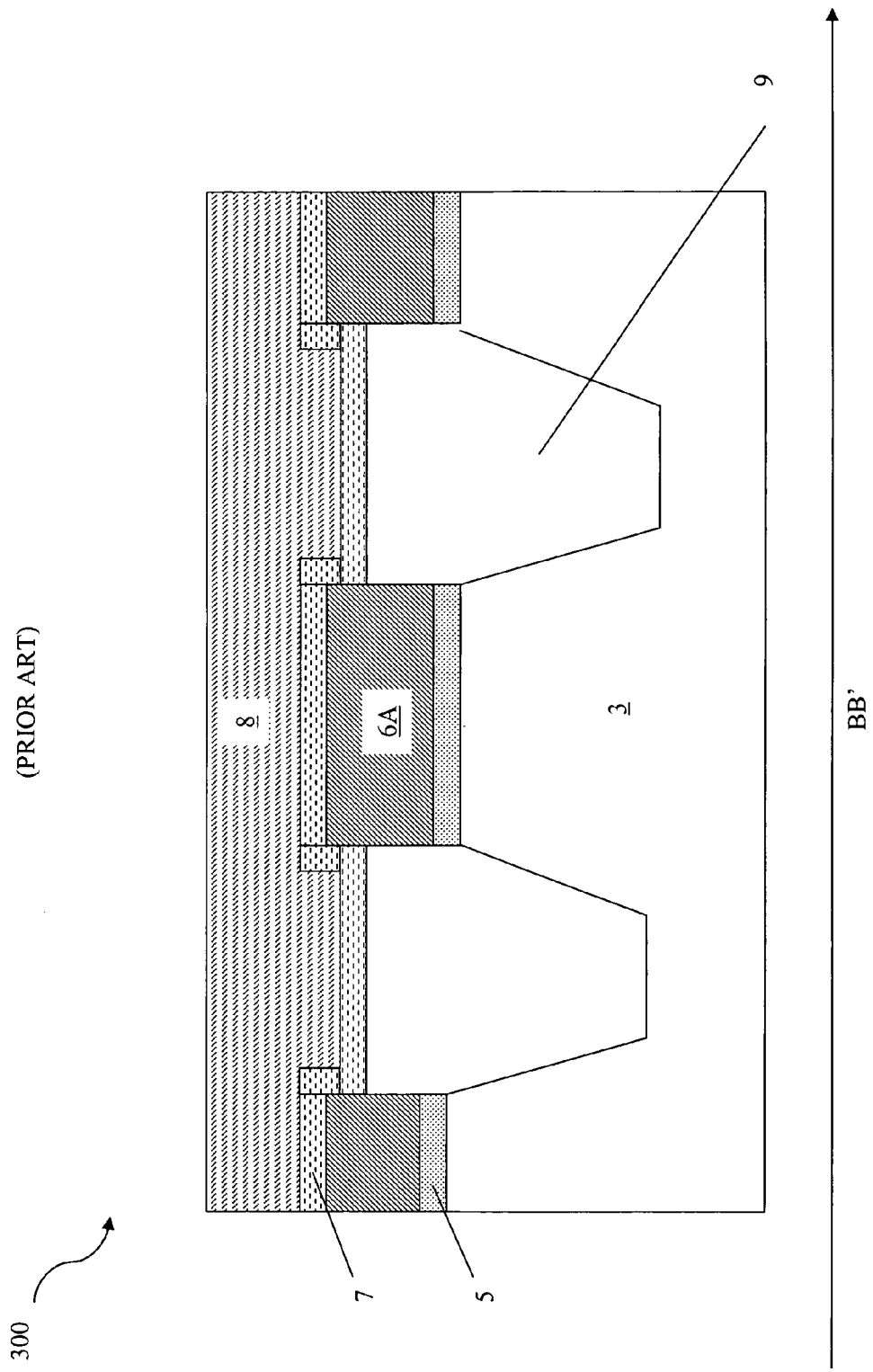
In FIG. 3 a flash memory cell with self-aligned insulation according to the prior art is shown, in schematic transversal section, along the direction BB'.
Figure 4:
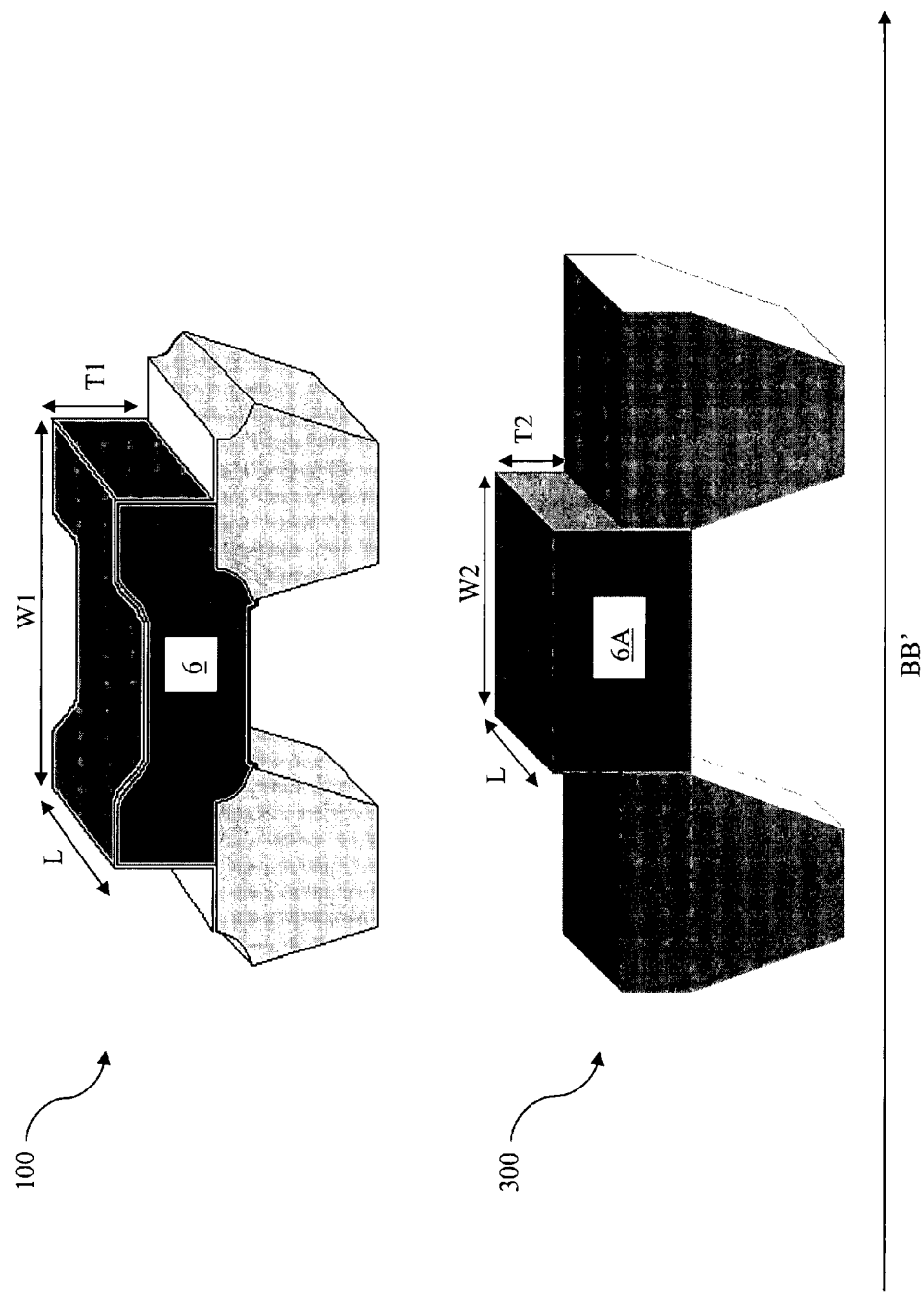
In FIG. 4 there is shown in perspective view a comparison between the morphology of the transversal section of a flash memory cell with self-aligned insulation and that of a traditional memory cell, according to the prior art, along the direction BB'.
Figure 5:
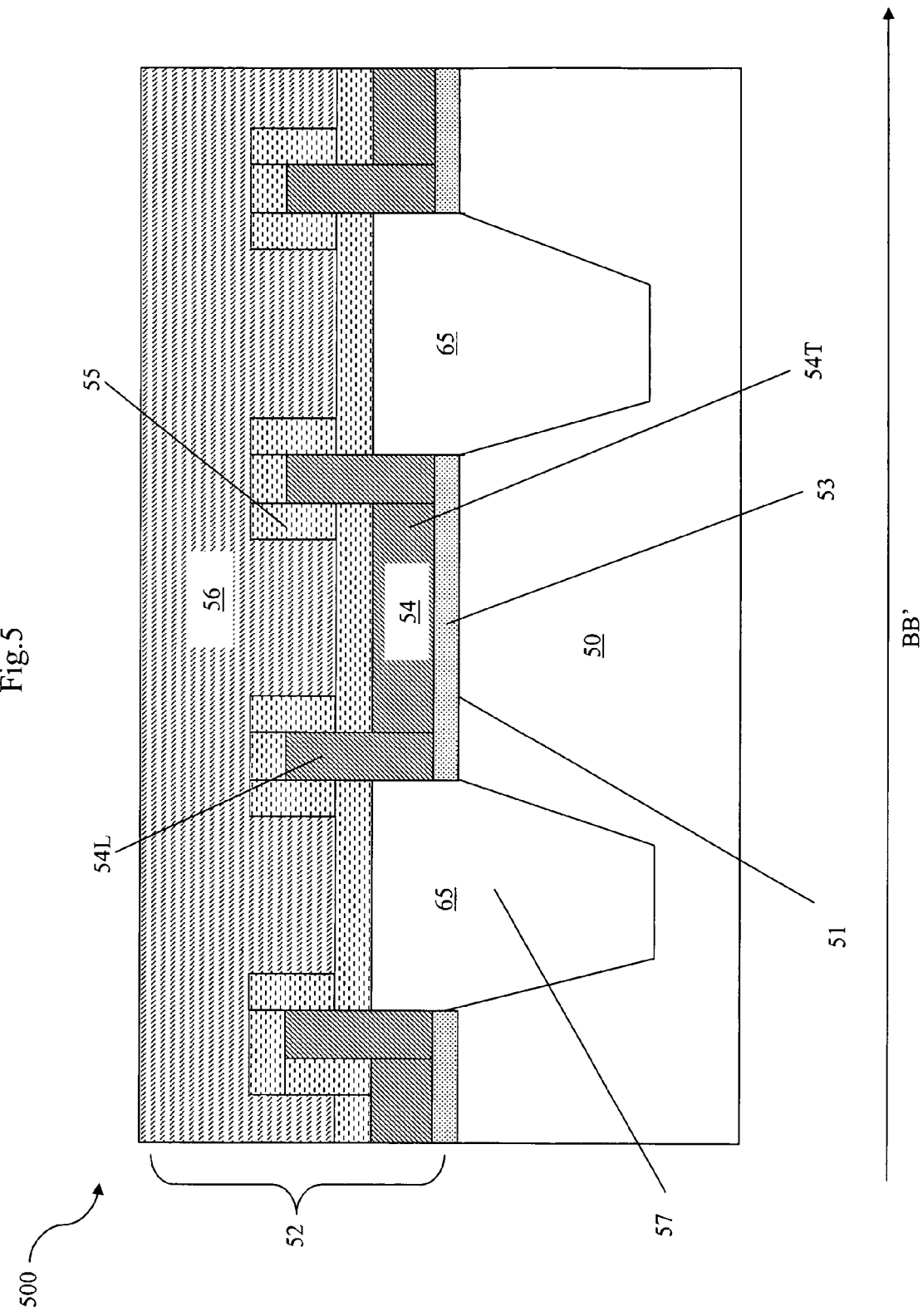
In FIG. 5 there is shown, in schematic transversal section and limited to the layers of interest, a non-volatile MOS memory cell with floating gate with self-aligned insulation according to an embodiment of the invention, along the direction BB'.

With reference to FIG. 5, an example of flash type memory cell 500 inside a non-volatile MOS memory device, obtained according to an embodiment of the invention, is represented in schematic transversal section, which is limited to the layers of interest along the direction BB', and which includes an electrically active region 51 inside a single crystalline silicon substrate 50, capped by a layer structure that constitutes the gate electrode region 52.

The gate electrode region 52 includes:
- a first thin dielectric layer 53, typically silicon oxide, called tunnel oxide;
- the floating gate 54, including a first conductor material layer, for example heavily doped polycrystalline silicon;
- a second dielectric layer 55, for example constituted by a $SiO_2/Si_3N_4/SiO_2$ layers sequence called ONO (oxide-nitride-oxide), that covers the floating gate 54;
- the control gate 56, formed by a second conductor material layer, for example heavily doped polycrystalline silicon.

Along the direction BB', the direction along which the word lines extend, adjacent memory cells 500 are separated by STI (shallow trench isolation) type isolation regions 57.

According to an embodiment of the invention, the floating gate 54 advantageously takes a concave, generically saddle shape. Particularly, the floating gate 54 includes a base wall 54T and side walls 54L, of shape and thickness such as to cause the floating gate 54 to exhibit a concavity facing upward that makes the floating gate take a generically "U" shape. This characteristic of the floating gate 54 provides a gate capacitive coupling $\alpha_G$ of the memory cell 500 that is higher compared to the prior art, and it favors a reduction of the reading disturbances associated with the capacitive couplings between the floating gates 54 of adjacent memory cells 500.

Particularly, according to an embodiment of the invention, said side walls 54L protrude from said base wall 54T to a height equal to at least five times the thickness of said base wall 54T.

The structure just described can be obtained according to an embodiment of the invention by the process flow that is described in the following, that is limited to the description of the process steps of interest, and is not exhaustive of a process flow suitable for obtaining an integrated memory device according to well known techniques.

With reference to FIGS. 6A-6D, an embodiment of the proposed innovative solution includes the following process steps for the formation of memory cells 500 with self-aligned insulation:

1. The tunnel oxide 53, of thickness ranging, for example, from 5 nm to 10 nm, is grown on the single crystalline silicon substrate 50 (FIG. 6A);
2. A conductor material layer 54A is deposited, for example heavily doped polycrystalline silicon, of thickness ranging, for example, from 50 nm to 150 nm, such as 100 nm, from which will be obtained the floating gate 54 of the memory cell 500 (FIG. 6A);
3. A silicon nitride layer 63 of thickness ranging, for example, from 100 nm to 200 nm, having the function of stop layer for the following planarization treatments, is deposited (FIG. 6A);
4. The insulation regions 57, for example of STI-type, are defined by lithography and etching of the silicon nitride 63, conductor material 54A, tunnel oxide 53 and single crystalline substrate 50 layers sequence, up to forming inside the single crystalline substrate 50 trenches of desired depth, for example a depth of about of 150 nm (FIG. 6B).

The conductor material layer 54A thus defined is self-aligned with the type STI isolation regions 57.

5. The trenches are filled with one or more layers of dielectric material, that form the field oxide 65 (FIG. 6C);
6. The field oxide 65 is planarized, using for example the CMP (chemical mechanical polishing) technique, so that its exposed surface is flush with that of the still present silicon nitride portion 63 (FIG. 6C).

Figure 7A:
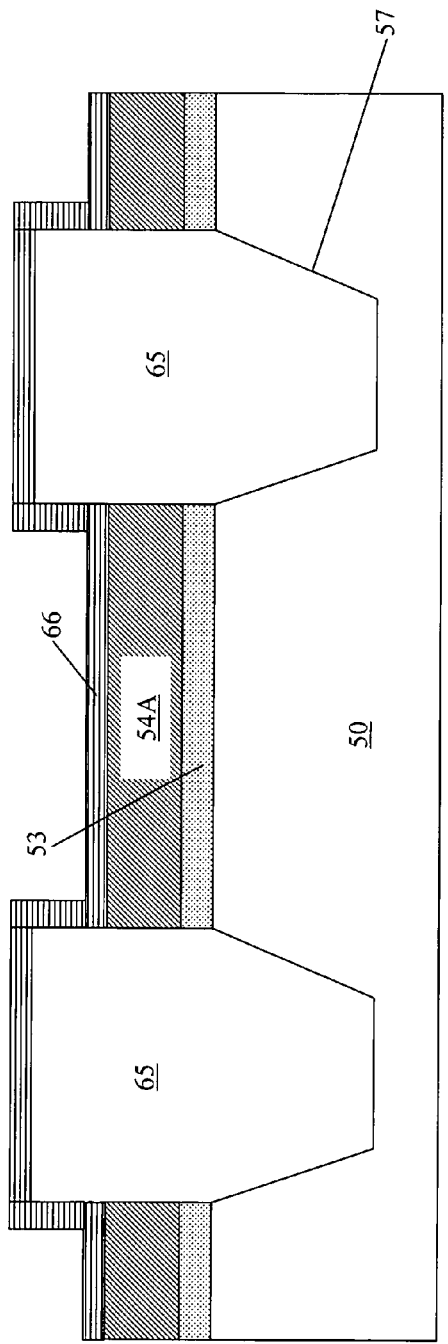
Figure 7B:
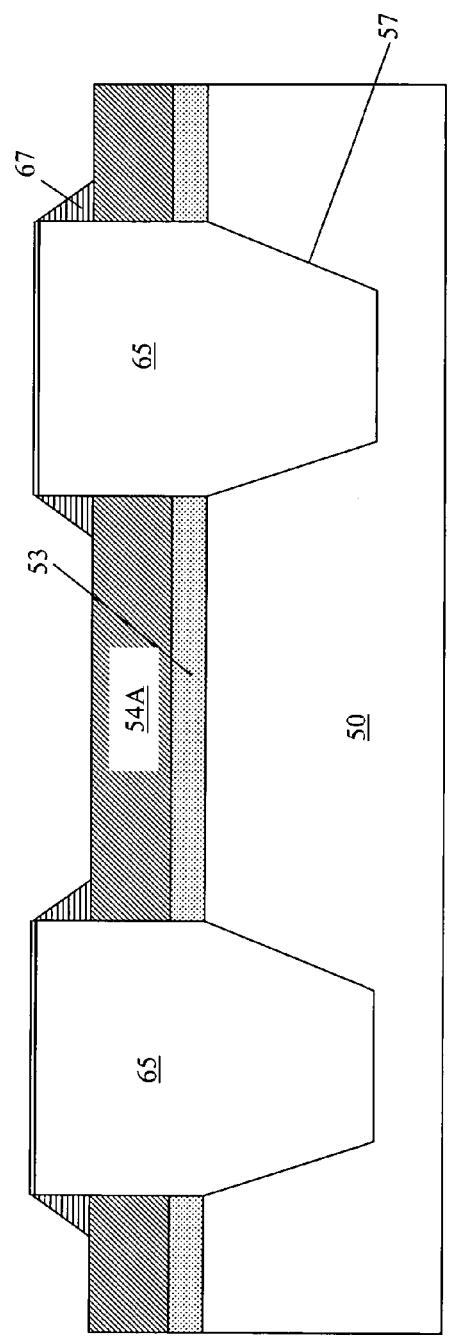
Figure 7E:
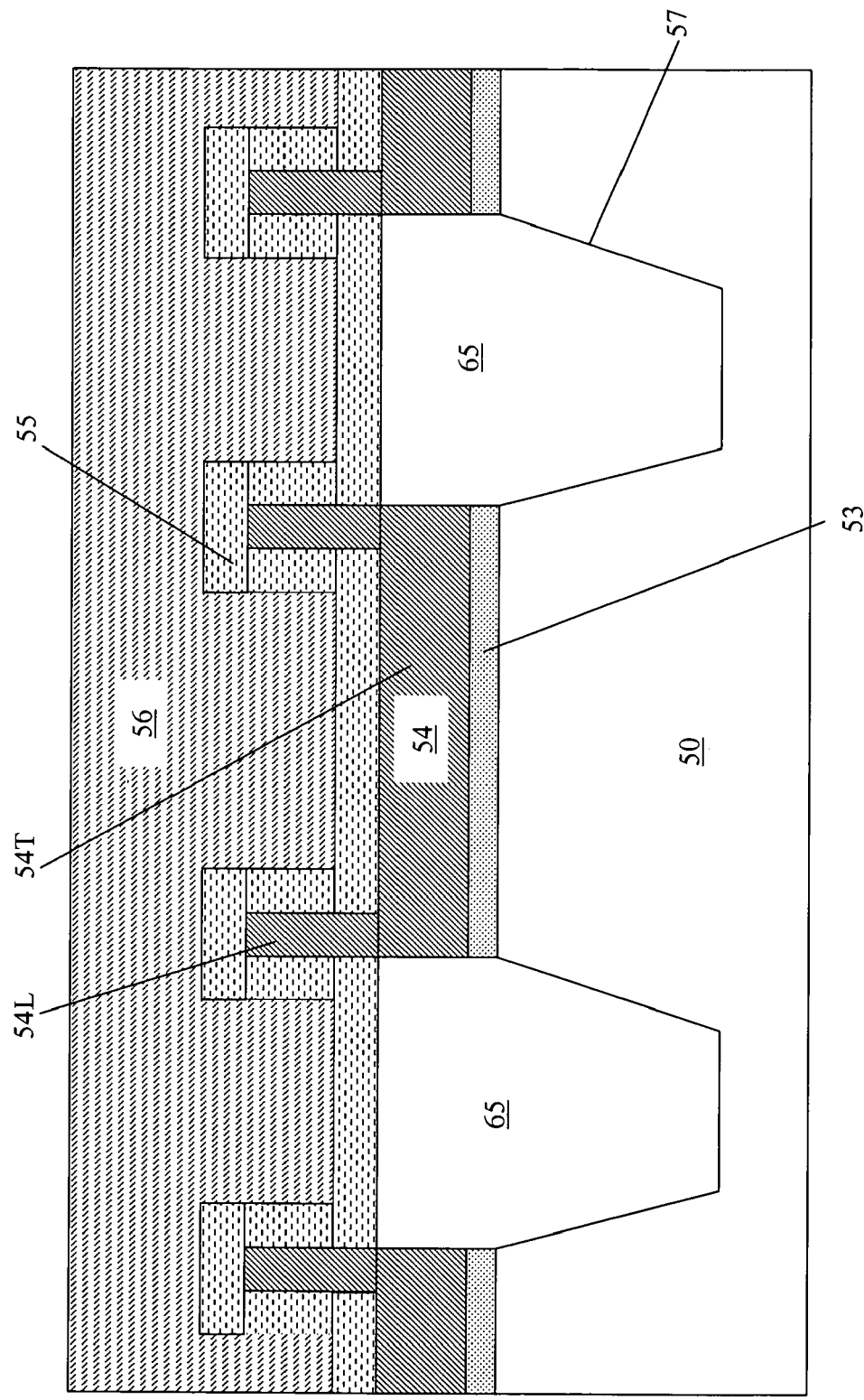

After having formed in this way the STI isolation regions 57, the process of formation of the floating gates 54 self-aligned to the STI isolation regions 57 proceeds with the following steps:

7. The portion of silicon nitride 63 still present is removed (FIG. 6D);

After the removal step (step 7) of the portion of the still present silicon nitride layer 63, a first embodiment of a method according to the invention proposes advantageously the following process steps, shown in FIGS. 7A-7E:

8. A dielectric layer 66, for example silicon oxide or silicon nitride of thickness such as to be conformal, and thus that is substantially following the profiles of the underlying layers, is deposited. The thickness of the dielectric layer 66 ranges, for example, from 5 nm to 15 nm (FIG. 7A);
9. The dielectric layer 66 just deposited is anisotropically etched, through an etch composition that is selective with respect to the conductor material of the layer 54A. If for example the layer 54A includes heavily doped polycrystalline silicon, etch compositions can be used that are based on oxygen and fluorine carbides as $C_4F_6$, $CF_4$, $C_4F_8$. In such a way, dielectric "spacers" 67 are defined above the conductor material layer 54A, at the sides of the field oxide 65 (FIG. 7B);
10. Exploiting the presence of the just defined dielectric "spacers" 67, the level of the conductor material layer 54A is lowered through an anisotropic etch that is selective with respect to the dielectric of which the "spacers" 67 are constituted. Such etch for example uses an etch composition based on oxygen and chlorine or based on oxygen and bromidic acid. The formation of the floating gate 54 is thus completed; the floating gate takes the concave saddle shape defined above, with base wall 54T and side walls 54L (FIG. 7C). Advantageously, in such a way it is the thickness of a deposited layer (side walls 67), and not a lithography operation, that defines the thickness of the side walls 54L. Therefore, very thin side walls 54L can be obtained, for example, of about 30 nm or even less.
11. The dielectric "spacers" 67 are removed through an isotropic etch that is selective with respect to the conductor material of which the floating gate 54 is formed, for example heavily doped polycrystalline silicon. In the case of removal of silicon oxide, an etch in hydrofluoric acid (HF) is for example used, and in the case of removal of silicon nitride, an etch in phosphoric acid is, for example, used (FIG. 7D);
12. The level of the field oxide 65 exposed surface is lowered through a wet etching, for example in hydrofluoric acid (HF), set in such a way to uncover the side walls 54L of the floating gate 54 (FIG. 7D). If the material of which the "spacers" 67 are formed is the same as the field oxide 65, the wet etching performed in this phase advantageously includes also the removal of the "spacers" 67 as indicated above in step 11;
13. The dielectric layer 55 is deposited, for example ONO (oxide-nitride-oxide), covering the floating gate 54 (FIG. 7E);
14. The control gate 56 is formed, for example made of heavily doped polycrystalline silicon (FIG. 7E).

The process continues according to a traditional scheme, with the definition of the gate electrode through anisotropic etching of the control gate 56, dielectric 55 and floating gate 54 layers sequence, followed by a known sequence of operations that lead to the realization of the finished memory device.

In alternative to the sequence of process phases just described, a second embodiment of a method according to the invention proposes, in the deposition phase (step 2) of the layer 54A, the deposition of a lower thickness of conductor material, for example, ranging from 30 nm to 40 nm. Also, the second embodiment proposes, after the removal phase (step 7) of the layer of silicon nitride 63, the following process steps, shown in schematic way in FIGS. 8A-8D:

8A. A conformal conductor material layer 54B is deposited, in such a way to substantially follow the profile of the underlying layers. The conformal layer 54B is, for example, of the same material as the layer 54A deposited before, for example heavily doped polycrystalline silicon. The conformal layer 54B of conductor material has a thickness ranging, for example, from 5 nm to 15 nm, and is short-circuited with the layer 54A of conductor material previously deposited, that forms the base wall 54T of the floating gate 54 (FIG. 8A);

9A. The conformal layer 54B just deposited is etched through an anisotropic selective etch with respect to the field oxide 65, to uncover the surface of the field oxide 65, in such a way as to form the side walls 54L' of the floating gate 54 (FIG. 8B).

The floating gate 54 thus formed takes the concave saddle shape defined above, with base wall 54T formed by the remaining portion of the conductor material layer 54A and side walls 54L' formed by the remaining portions of the conformal layer 54B. Advantageously, in this way the thickness of a deposited layer (the layer 54D), and not a lithography operation, defines the thickness of the side walls 54L'. Therefore, very thin side walls 54L' can be obtained, for example, of about 30 nm or even less.

Figure 8C:
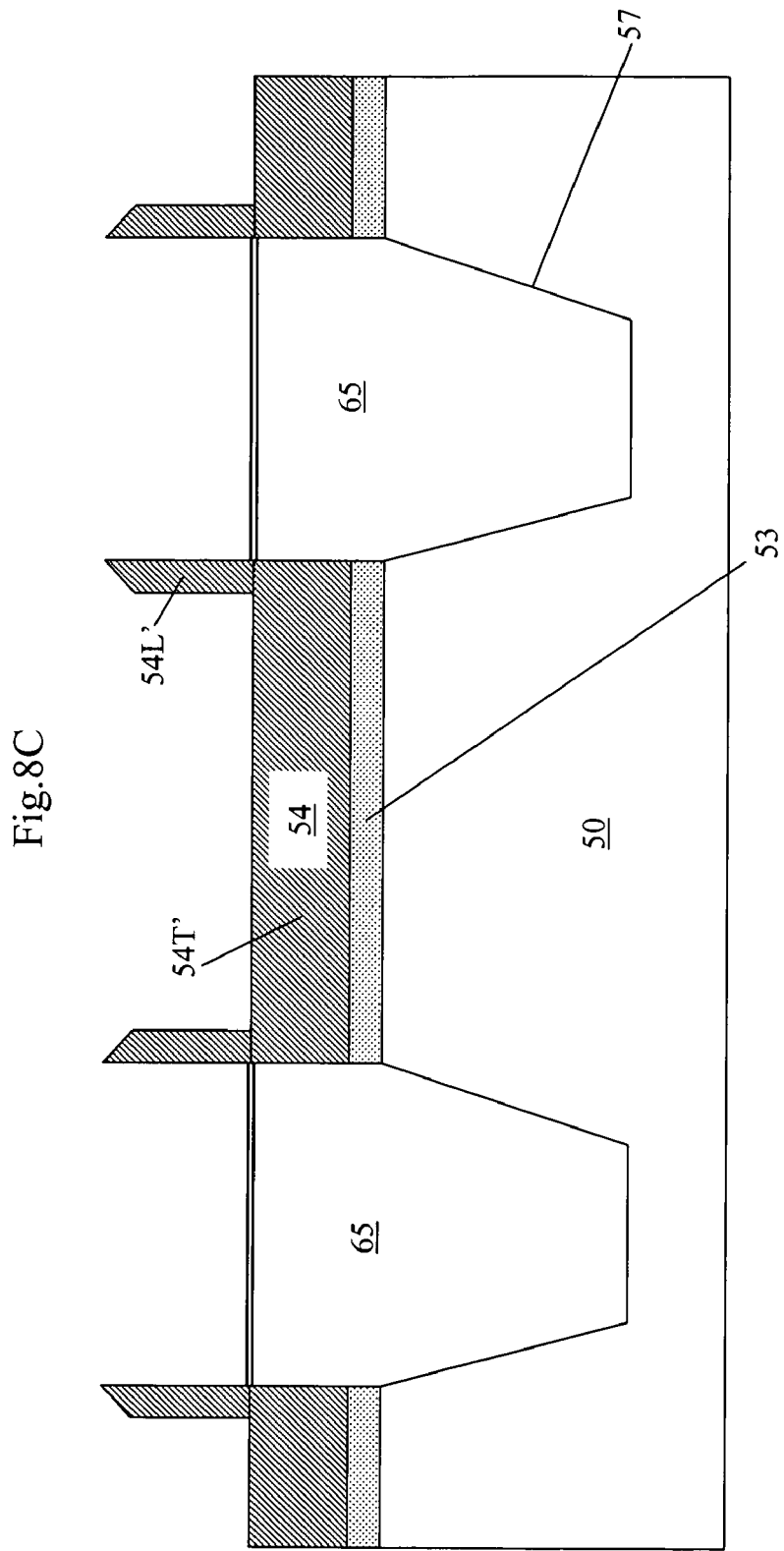
Figure 8D:
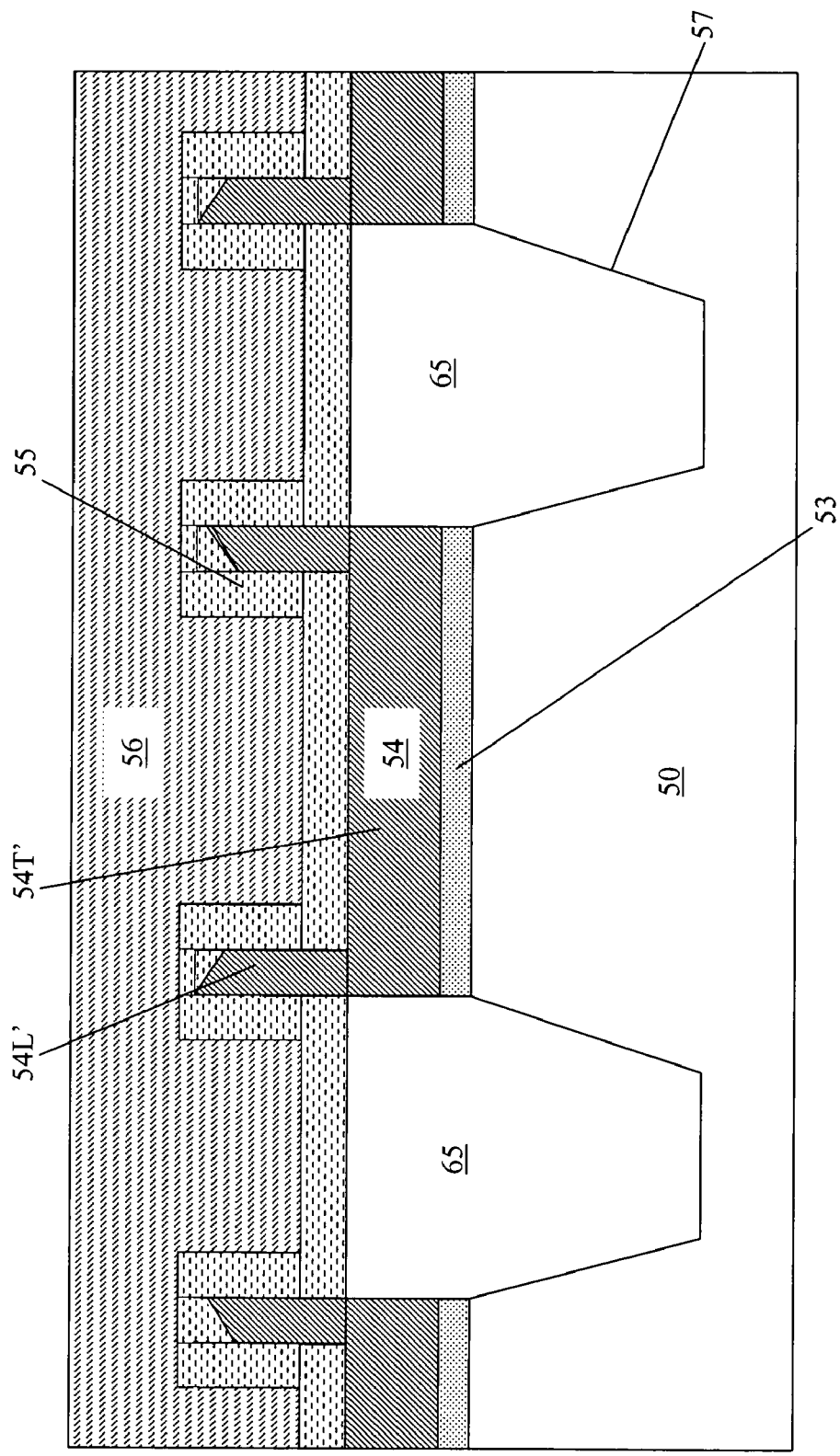

13A. The level of the exposed field oxide surface 65 is lowered, by a wet etching, for example in hydrofluoric acid (HF), in such a way to uncover the side walls 54L of the floating gate 54 (FIG. 8C);

14A. The dielectric layer 55 is deposited, for example ONO (oxide-nitride-oxide), covering the floating gate 54 (FIG. 8D);

15A. The control gate 56 is formed, made for example of heavily doped polycrystalline silicon (FIG. 8D).

The process proceeds according to a traditional scheme, with the definition of the gate electrode by anisotropic etch of the control gate 56, dielectric 55 and the floating gate 54 layers sequence, followed by a sequence of known operations that lead to the fabrication the finished memory device.

By the method just described, an embodiment of the invention makes a floating gate non-volatile semiconductor memory device of very reduced geometric dimensions, typical of memory devices with self-aligned insulation, in which nevertheless the memory cells advantageously possess a capacitive coupling coefficient $\alpha_G$ higher than that obtainable according to the prior art, overcoming limitations and drawbacks that limit the known devices of this type.

In fact, thanks particularly to the the floating-gate shape, the portion of the floating-gate surface that faces the control gate is greater than that obtainable according the prior art.

Accordingly, the capacitive coupling coefficient $\alpha_G$ being directly proportional to the area of the floating gate surface facing the control gate, its value is greater than that obtainable by known methods.

Such a higher value of the capacitive coupling coefficient $\alpha_G$ significantly improves the efficiency of the programming and erasing operations of the memory cells, thus overcoming problems present in memory devices made according to the prior art.

Advantageously, the, above-described embodiments allow obtaining a higher value of the capacitive coupling coefficient $\alpha_G$ without the addition of lithographic phases, that can produce misalignments and dimensional problems.

In addition, the above-described embodiments allow making a floating gate non-volatile semiconductor memory device in which the parasitic capacitive coupling between adjacent memory cells is advantageously reduced with respect to that obtainable according to the prior art.

This advantage is due to the fact that the obtained floating gate, thanks to the peculiar concave saddle shape, possesses side walls of lower area than the devices made according to the prior art.

In fact, based on the model of a capacitor with plane and parallel plates, the parasitic capacitive coupling between adjacent memory cells, particularly in the direction AA' along which the bit lines extend, is directly proportional to the area of the walls of the floating gates of adjacent cells facing each other.

Since it is advantageously the thickness of a deposited layer, and not a lithography operation, that defines the thickness of the side walls of the floating gate, the above-described embodiments allow making the side walls of floating gates of adjacent memory cells of very reduced thickness, if desired thinner than the base wall, thereby allowing the formation of adjacent memory cells with reduced parasitic capacitive coupling.

This peculiarity is particularly advantageous in the case of NAND flash-type floating gate non-volatile semiconductor memory devices, in which the disturbances due to the parasitic capacitive coupling between adjacent memory cells currently represent one of the causes of variation of the threshold voltage in the memory cell matrixes.

Also, it is particularly useful applying the above-described embodiments to multilevel flash memories, in which the reduced threshold variation margins between the different programming states make the correct operation of the memory cells particularly critical in the presence of a high parasitic capacitive coupling between adjacent memory cells.

The above-described embodiments are therefore very advantageous in the case of NOR or NAND flash type or multilevel floating gate non-volatile semiconductor memory devices, but they can be applied to any semiconductor memory device in which it is desired to have a wide coupling area between the floating gate and any other electrode.

Memory cells formed according to the above-described embodiments may be included in an integrated circuit (IC) such as a memory IC, which may be included in an electronic system such as a computer system.

From the foregoing it will be appreciated that, although specific embodiments of the invention have been described herein for purposes of illustration, various modifications may be made without deviating from the spirit and scope of the invention.

What is claimed is:

1. A non-volatile MOS semiconductor memory cell, comprising:
   a substrate of semiconductor material;
   isolation regions formed in said substrate;
   an electrically active region surmounted by a gate electrode, said gate electrode being electrically isolated from said substrate by a first dielectric layer, said gate electrode including a U-shaped floating gate, said U-shaped floating gate comprising a base with a top surface planar with the top surfaces of said isolation regions and comprising a pair of sidewalls that extends vertically above, but not over, the top surfaces of said isolation regions, wherein said U-shaped floating gate includes a base wall and the pair of side walls protruding from said base wall in proximity of said isolation regions, and wherein said base wall has a greater thickness than the thickness of each of said side walls.

2. The memory cell of claim 1, wherein the thickness of each said wall ranges from 20nm to 40nm.

3. The memory cell of claim 1, wherein each of said side walls has a thickness lower than 30nm.

4. The memory cell of claim 1, wherein each of said side walls protrudes from said base wall of an equal height of at least 5times the thickness of said base wall.

5. The memory cell of claim 1, wherein said U-shaped floating gate includes at least one doped or undoped polycrystalline silicon layer.

6. The memory cell of claim 1, wherein said gate electrode further includes a control gate electrically separated from said U-shaped floating gate by a second dielectric layer.

7. The memory cell of claim 1, wherein said isolation regions are STI-type (shallow trench isolation).

8. A non-volatile MOS semiconductor memory cell, comprising:
a substrate of semiconductor material;
isolation regions formed in said substrate;
an electrically active region surmounted by a gate electrode, said gate electrode being electrically isolated from said substrate by a first dielectric layer, said gate electrode including a U-shaped floating gate, said U-shaped floating gate comprising a base with a top surface planar with the top surfaces of said isolation regions and comprising a pair of sidewalls that extends vertically above, but not over, the top surfaces of said isolation regions, wherein said U-shaped floating gate includes a base wall and the pair of side walls protruding from said base wall in proximity of said isolation regions, and wherein each of said side walls protrudes from said base wall of an equal height of at least 5times the thickness of said base wall.

9. The memory cell of claim 8, wherein the thickness of each said wall ranges from 20nm to 40nm.

10. The memory cell of claim 8, wherein each of said side walls has a thickness lower than 30nm.

11. The memory cell of claim 8, wherein said U-shaped floating gate includes at least one doped or undoped polycrystalline silicon layer.

12. The memory cell of claim 8, wherein said gate electrode further includes a control gate electrically separated from said U-shaped floating gate by a second dielectric layer.

13. The memory cell of claim 8, wherein said isolation regions are STI-type (shallow trench isolation).

* * * * *